United States Patent
Jo

(10) Patent No.: US 7,532,521 B2
(45) Date of Patent: May 12, 2009

(54) NOR-NAND FLASH MEMORY DEVICE WITH INTERLEAVED MAT ACCESS

(75) Inventor: Seong-Kue Jo, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/464,454

(22) Filed: Aug. 14, 2006

(65) Prior Publication Data
US 2007/0086243 A1 Apr. 19, 2007

(30) Foreign Application Priority Data
Oct. 18, 2005 (KR) .................... 10-2005-0098207

(51) Int. Cl.
*G11C 7/10* (2006.01)
(52) U.S. Cl. ................. 365/189.05; 365/189.17; 365/203
(58) Field of Classification Search ............ 365/189.05, 365/189.15, 189.16, 185.12, 189.17, 203
See application file for complete search history.

(56) References Cited

U.S. PATENT DOCUMENTS

| | | | |
|---|---|---|---|
| 6,421,274 B1 | 7/2002 | Yoshimura | |
| 6,434,658 B1 | 8/2002 | Fukuzumi | |
| 6,630,856 B2 * | 10/2003 | Do et al. ............... | 327/407 |
| 6,744,692 B2 | 6/2004 | Shiota et al. | |
| 6,762,963 B2 * | 7/2004 | Inoue et al. ............... | 365/200 |
| 6,784,889 B1 * | 8/2004 | Radke ............... | 345/531 |
| 6,967,870 B2 * | 11/2005 | Jenq et al. ............... | 365/185.17 |
| 2002/0118591 A1 * | 8/2002 | Ayukawa et al. ....... | 365/230.03 |
| 2003/0117851 A1 | 6/2003 | Lee et al. | |
| 2004/0225829 A1 * | 11/2004 | Akiyama et al. ............ | 711/104 |
| 2005/0226046 A1 * | 10/2005 | Lee et al. ............... | 365/185.12 |
| 2006/0133145 A1 | 6/2006 | Park et al. | |

FOREIGN PATENT DOCUMENTS

| | | |
|---|---|---|
| JP | 2000-293427 | 10/2000 |
| JP | 2002-288034 | 10/2002 |
| JP | 2003-216483 | 7/2003 |
| KR | 2003-0067494 | 8/2003 |

OTHER PUBLICATIONS

English language abstract of Japanese Publication No. 2000-293427.
English language abstract of Japanese Publication No. 2002-288034.
English language abstract of Japanese Publication No. 2003-216483.
English language abstract of Korean Publication No. 2003-0067494.

* cited by examiner

*Primary Examiner*—Huan Hoang
*Assistant Examiner*—Kretelia Graham
(74) *Attorney, Agent, or Firm*—Marger Johnson & McCollom, P.C.

(57) ABSTRACT

In a NOR-NAND flash memory device, data bits may be alternately selected from first and second mats. A selected wordline in a mat may be kept active until completing a read operation for data bits of more than one memory cells coupled to the selected wordline.

13 Claims, 4 Drawing Sheets

US 7,532,521 B2

NOR-NAND FLASH MEMORY DEVICE WITH INTERLEAVED MAT ACCESS

CROSS-REFERENCE TO RELATED APPLICATIONS

This application claims priority from Korean Patent Application No. 2005-98207, filed on Oct. 18, 2005, which is incorporated by reference.

BACKGROUND

With the rapid development of various mobile systems and other applications, the importance of flash memories as nonvolatile storage device is increasing. Flash memories are advantageous to use in terms of high data storage capacity. However, compared to random-access memories, flash memory devices are relatively slow during read and write operations, and this may affect the performance of systems employing them.

The long access time of flash memories may be compensated by using buffer memories. For instance, data to be transferred from a host to a flash memory is first stored in a buffer memory; then the data is written from the buffer memory to the flash memory. Similarly, data read from the flash memory may be first stored in the buffer memory and then the data may be transferred to the host. With such a data transmission scheme, it is possible to enhance the performance of memory systems and/or information processing systems.

One type of flash memory device employs a NAND-type memory cell array with a NOR-type interface to retain the benefits of NAND memory while providing the higher access speeds of NOR-type flash memory. An example of such a hybrid device, which will be referred to herein as NOR-NAND memory, is Samsung's OneNAND® brand flash memory. NOR-NAND flash memory devices have the buffer and flash memories integrated on a single chip along with a control logic block. Such a prior art NOR-NAND flash memory device is schematically illustrated in FIG. 1.

Referring to FIG. 1, the NOR-NAND flash memory device 1000 executes read and write operations in response to requests from a host 2000. The NOR-NAND flash memory device 1000 includes a nonvolatile memory core 1200, a buffer memory 1400, and a control block 1600. The nonvolatile memory core 1200 includes a nonvolatile memory cell array 1220 and a page buffer 1240, being regulated by the control block 1600. The page buffer 1240 reads page data (i.e., data corresponding to a quantity of one page) from the nonvolatile memory cell array, and temporarily stores the readout data therein. The buffer memory 1400 is configured to conduct the read and write operations under the control of the control block 1600, temporarily holding the page data output from the nonvolatile memory core 1200. The buffer memory 1400 is designed to sufficiently accommodate the page data. The buffer memory 1400, for example, may be a static RAM (hereinafter, referred to as "SRAM"). The page data are sequentially transferred to the host 2000 from the buffer memory 1400 in a unit in sync with a clock signal.

FIG. 2 is a schematic block diagram illustrating the prior art buffer memory 1400 of FIG. 1. Referring to FIG. 2, the buffer memory 1400, which may be an SRAM, includes a memory cell array 1410, a row selection circuit 1420, a column selection circuit 1430, a sense amplifier circuit 1440, and a data output circuit 1450. The row selection circuit 1420 activates wordlines WLi (i=0~m-1) in sequence when the read operation begins. When each wordline is selected, bitlines BLj (j=0~n-1) of the memory cell array 1410 are designated by the column selection circuit 1430 in a regular unit. The sense amplifier circuit 1440 detects and latches data bits through the bitlines designated by the column selection circuit 1430. The data output circuit 1450 outputs data bits to an external device from the sense amplifier circuit 1440. The buffer memory 1400 stores a quantity of one page of data (i.e., page data). The page data stored in the buffer memory 1400 are stored in memory cells of plural rows (i.e., the memory cells of all rows included in the memory cell array 1410), rather than the memory cells of a single row.

An SRAM, when used as the buffer memory 1400, sequentially performs address decoding, wordline activation, column decoding, bitline sensing, data latch on bitlines, and wordline deactivation in one cycle of a clock signal. When a selected row is deactivated, another row is activated after precharging the bitlines. A wordline is fixed in active-inactive and precharging periods. If the data transfer rate (or the data burst frequency) from the buffer memory to the host increases, the period A shown in FIG. 3 decreases. When the data burst frequency is increased to achieve a higher data transfer rate, it is more difficult to assure that the precharge time can be completed during period A. In other words, the precharging operation, which needs to be carried out every clock cycle, acts to restrict elevation of the data transfer rate (or the data burst frequency) from the buffer memory 1400 to the host 2000.

SUMMARY

Some aspects of the present invention relate to a NOR-NAND flash memory device in which data bits may be alternately selected from first and second mats. In one embodiment, A NOR-NAND flash memory device may include a nonvolatile memory core, and a buffer memory to temporarily store data for the nonvolatile memory core, wherein the buffer memory may include a plurality of wordlines and bitlines, and logic to keep a selected wordline active until completion of a read operation of more than one memory cells associated with the selected wordline.

The memory may further include logic to precharge one or more bitlines after completion of the read operation of the more than one memory cells associated with the selected wordline. The buffer memory storage area may be divided into first and second mats, each mat including a plurality of wordlines and bitlines. The first mat may include a first wordline and logic to keep the first wordline active until completion of a read operation of more than one memory cells associated with the first wordline, and the second mat includes a second wordline and logic to keep the second wordline active until completion of a read operation of more than one memory cells associated with the second wordline. A multiplexer may alternately select and transfer data bits from the first and the second mats in response to a selection signal. The buffer memory may further include a first precharging circuit configured to precharge columns of the first mat in response to a first precharging signal, and a second precharging circuit configured to precharge columns of the second mat in response to a second precharging signal.

Some other aspects of the present invention relate to a NOR-NAND flash memory device in which a selected wordline in a mat may be kept active until completing a read operation for data bits of more than one memory cells coupled to the selected wordline. In one embodiment a NOR-NAND flash memory device may include a nonvolatile memory cell array, a page buffer to read page data from the nonvolatile memory cell array, and a buffer memory to temporarily store the page data of the page buffer, wherein the buffer memory includes first and second mats including memory cells arranged on rows and columns, a row decoder circuit to sequentially activate corresponding rows of the first and second mats in response to a row address, and a multiplexer to alternately select data bits from the first and the second mats.

The memory may further include logic to keep the corresponding rows of the first and the second mat active until completion of a read operation of more than one memory cells associated with the active rows, and logic to deactivate the corresponding rows of the first and the second mat upon completion of the read operation of more than one memory cells associated with the active rows. The memory may also include logic to precharge bit lines of the first and the second mat upon deactivation of the corresponding rows of the first and the second mat. The memory may also include a clock generation circuit may generate first and second internal clock signals and a selection signal in response to an external clock signal provided from a host, a first read circuit to sequentially select columns of the first mat in a predetermined unit and detecting data bits from the selected columns and operate in sync with the first internal clock signal, a second read circuit to sequentially select columns of the second mat in a predetermined unit and detecting data bits from the selected columns and operate in sync with the second internal clock signal, a multiplexer to alternately select data bits detected by the first and second read circuits in response to the selection signal and operate in sync with the external clock signal, and a shift register to latch data bits transferred through the multiplexer and operate in sync with the external clock signal. Each of the read circuits may include a column decoder to select columns of the corresponding mat in a predetermined unit in response to a column address, and a sense amplifier to detect data bits from bitlines selected by the column decoder.

BRIEF DESCRIPTION OF THE DRAWINGS

Non-limiting and non-exhaustive embodiments of the present invention will be described with reference to the following figures, wherein like reference numerals refer to like parts throughout the various figures unless otherwise specified.

DETAILED DESCRIPTION

Some embodiments of the invention will be described below in more detail with reference to the accompanying drawings. The inventive principles may, however, be embodied in different forms and should not be constructed as limited to the embodiments set forth herein. Rather, these embodiments are provided so that this disclosure will be thorough and complete, and will fully convey the scope of the invention to those skilled in the art.

Figure 4:
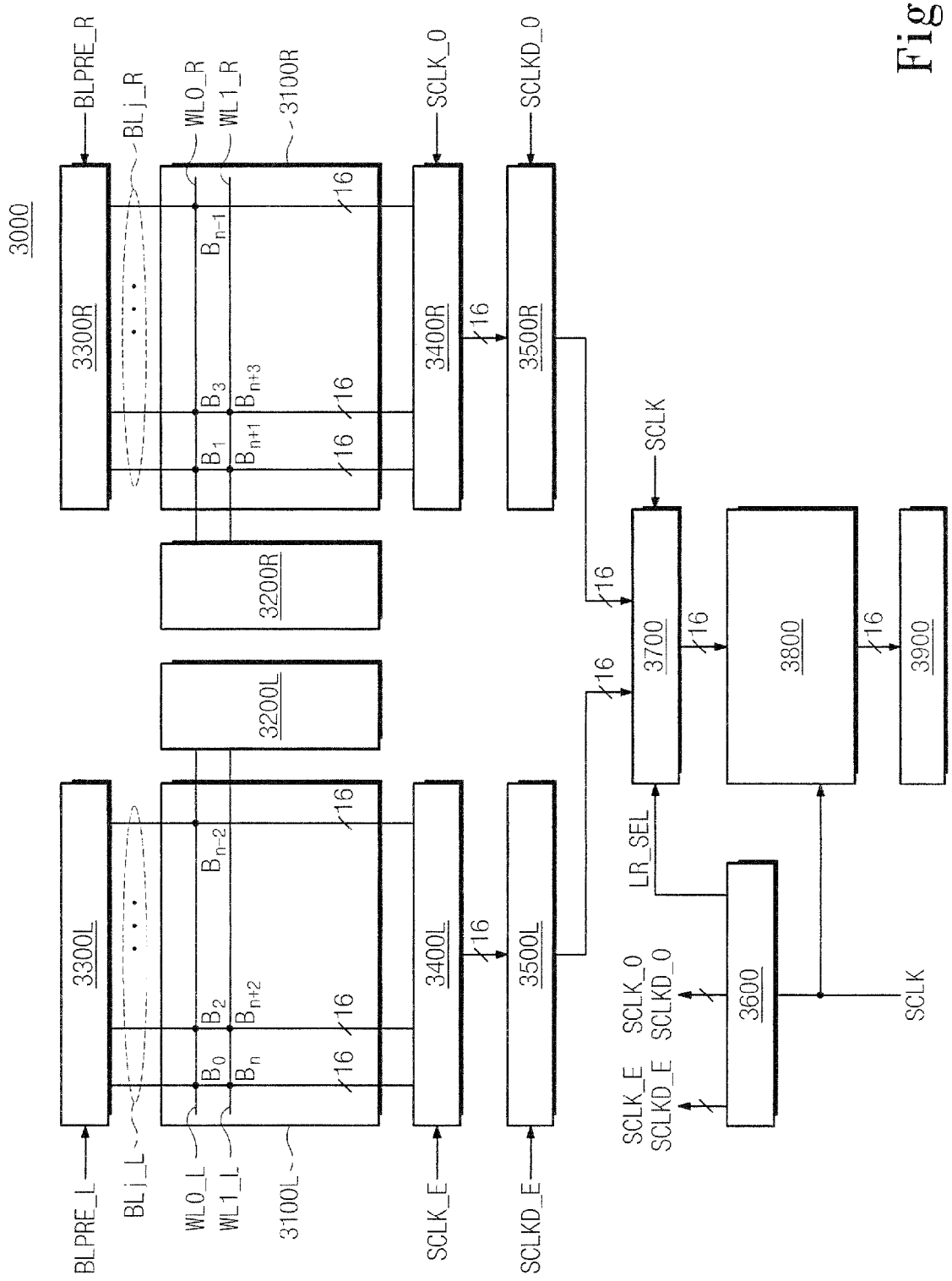
FIG. 4 is a block diagram illustrating an exemplary embodiment of a buffer memory according to some of the inventive principles of this patent disclosure.

FIG. 4 illustrates an exemplary embodiment of a buffer memory according to some of the inventive principles of this patent disclosure. The buffer memory 3000 may be used in a NOR-NAND flash memory device, and the data storage capacity of the buffer memory may be sufficient to store page data. The buffer memory 3000 may adopt a leveled wordline driving scheme in which a selected wordline is kept active until a read operation for data bits of some or all of the memory cells coupled to the selected wordline is completed.

A memory cell array of the buffer memory 3000 may include two mats 3100L and 3100R. Each mat 3100L or 3100R is composed of memory cells arranged in rows (i.e., wordlines) and columns (i.e., bitlines). The memory cells may be formed of SRAM cells. The buffer memory 3000 also includes a row decoder circuit composed of row decoders 3200L and 3200R corresponding to the mats 3100L and 3100R, respectively. Wordlines WLi_L (i=0~m−1) of the mat 3100L are driven by the row decoder 3200L, while wordlines WLi_R (i=0~m−1) of the mat 3100R are driven by the row decoder 3200R. The row decoders 3200L and 3200R may activate their corresponding wordlines simultaneously or sequentially in response to the same row address during a read operation. For instance, the wordline WL0_L of the mat 3100L may be activated by the row decoder 3100L, and after some time, the wordline WL0_R of the mat 3100R may be activated by the row decoder 3200R. The time between the activation of WL0_L and WL0_R may be predetermined (for e.g., X cycles of the clock signal, where X is an integer that is 1 or more).

The buffer memory 3000 also includes precharging circuits 3300L and 3300R, corresponding to mats 3100L and 3100R, respectively. The precharging circuit 3300L preliminarily charges the bitlines BLj_L (j=0~n−1) up to a predetermined voltage level in response to a control signal BLPRE_L. The precharging circuit 3300R preliminarily charges the bitlines BLj_R (j=0~n−1) up to a predetermined voltage level in response to a control signal BLPRE_R. The control signals BLPRE_L and BLPRE_R may be generated from a control circuit that generally regulates operation of the buffer memory 3000. A column decoder 3400L may operate in sync with a clock signal SCLK_E, sequentially selecting the bitlines BLj_L (j=0~n−1) of the mat 3100L in a predetermined unit (e.g., ×16). A sense amplifier 3500L of the buffer memory 3000 detects and latches data bits on bitlines selected by the column decoder 3400L in response to a clock signal SCLKD_E. Similarly, a column decoder 3400R may operate in sync with a clock signal SCLK_O, sequentially selecting the bitlines BLj_R (j=0~n−1) of the mat 3100R in a predetermined unit (e.g., ×16). A sense amplifier 3500R detects and latches data bits on bitlines selected by the column decoder 3400R in response to a clock signal SCLKD_O.

The first column decoder 3400L and the first sense amplifier 3500L constitute a first read circuit for selecting the columns of the first mat 3100L and for sensing data bits from the selected columns. The second column decoder 3400R and the second sense amplifier 3500R constitute a second read circuit for selecting the columns of the second mat 3100R and for sensing data bits from the selected columns.

Figure 1:
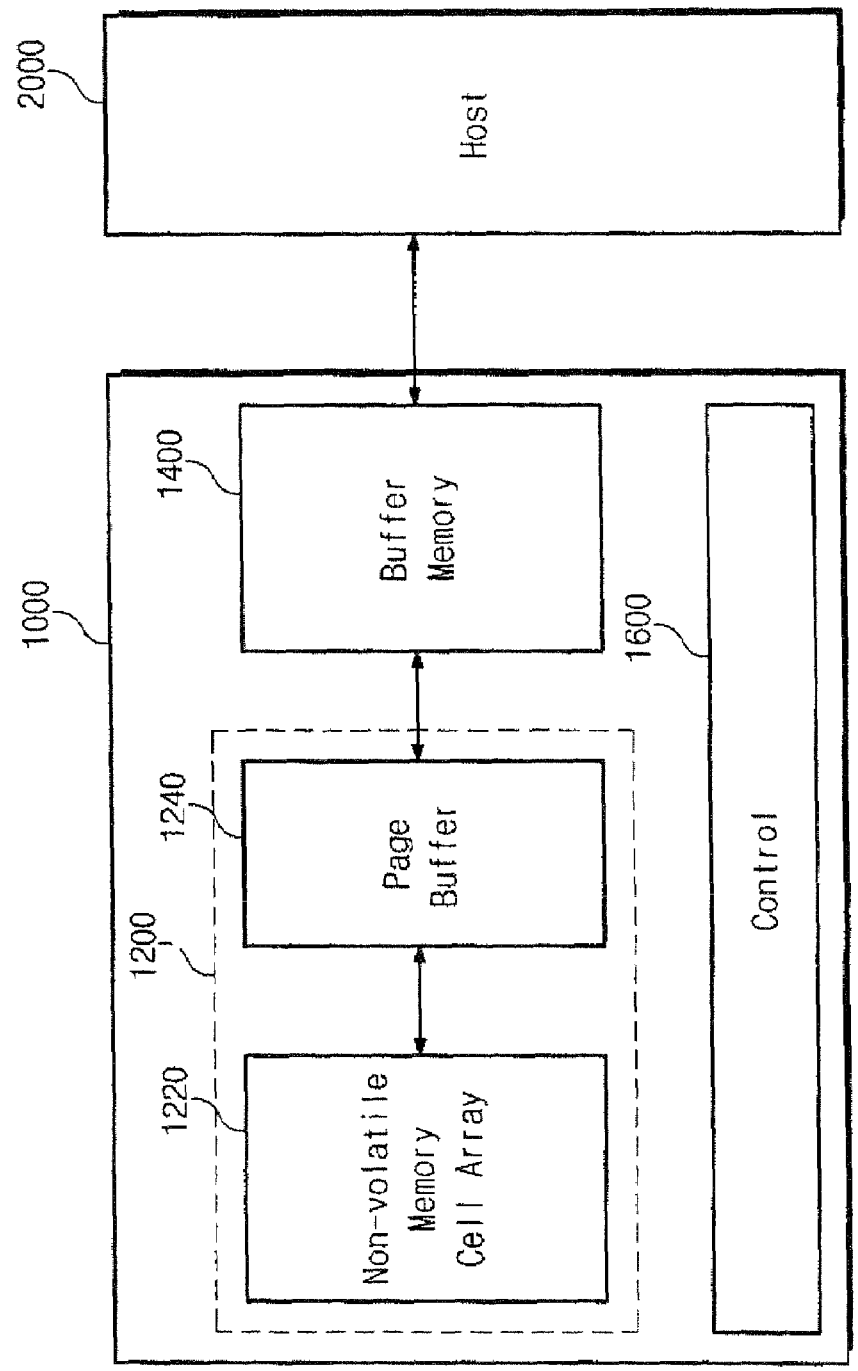
FIG. 1 is a schematic block diagram illustrating a general prior art NOR-NAND flash memory device.
Figure 2:
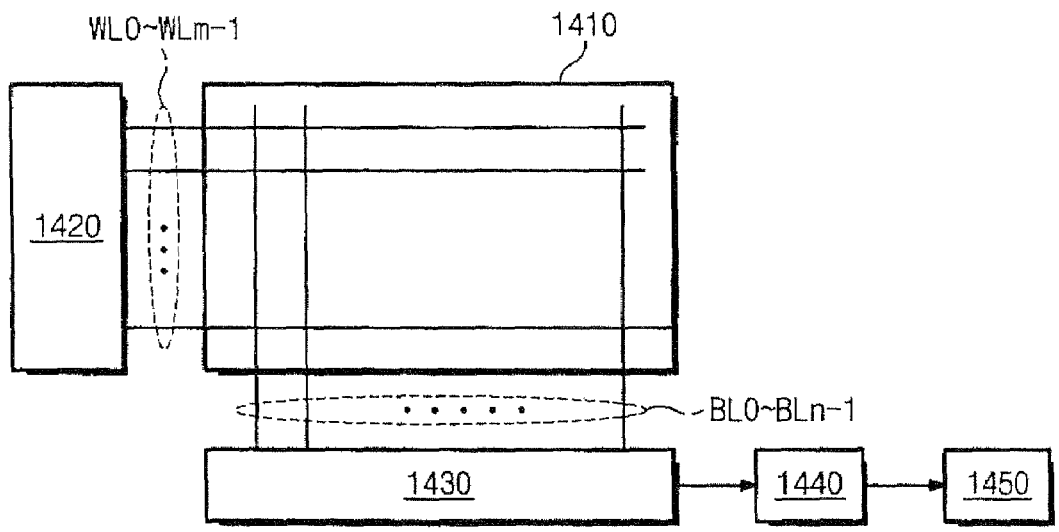
FIG. 2 is a schematic block diagram illustrating the prior art buffer memory 1400 of FIG. 1.
Figure 3:
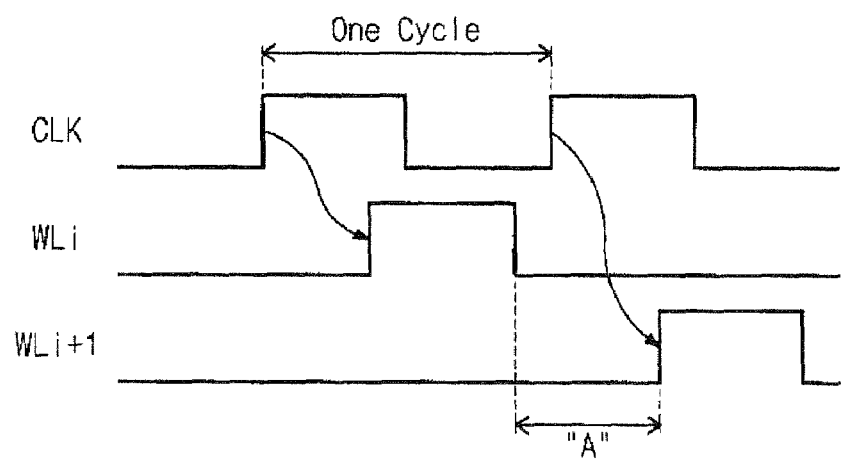
FIG. 3 is a timing diagram showing a prior art general pulsed wordline driving scheme.

A clock generation circuit 3600 may provide the clock signals SCLK_E, SCLKD_E, SCLK_O, and SCLKD_O in response to the clock signal SCLK (e.g., an external clock signal) supplied from an external source or a host, as shown in FIG. 1. The clock signal SCLK_E may be generated in sync with an even-ordered cycle of the clock signal SCLK. The clock signal SCLK_O may be generated in sync with an odd-ordered cycle of the clock signal SCLK. The clock signals SCLK_E and SCLK_O, as internal clock signals, have cycle periods multiplied from the clock signal SCLK. The clock signal SCLKD_E is delayed from the clock signal SCLK_E, while the clock signal SCLKD_O is delayed from the clock signal SCLK_O. A selection signal LR_SEL may be configured to have the same phase with the clock signal SCLKD_E, or may follow SCLKD_E with a predetermined phase lag. For example, the selection signal LR_SEL may be the same as the delayed clock signal SCLKD_E or obtained by delaying the delayed clock signal SCLKD_E.

A multiplexer 3700 of the buffer memory 3000 alternatively selects outputs of the sense amplifiers 3500L and 3500R in response to the clock signal SCLK and the selection signal LR_SEL. For instance, when the selection signal LR_SEL is high, the multiplexer 3700 selects an output data bit of the sense amplifier 3500L in response to a low-to-high transition of the clock signal SCLK, and outputs the selected data bit to a shift register 3800. When the selection signal LR_SEL is low, the multiplexer 3700 selects an output data bit of the sense amplifier 3500R in response to a low-to-high transition of the clock signal SCLK, and outputs the selected data bit to the shift register 3800. The shift register 3800 receives an output data bit from the multiplexer 3700 in response to the clock signal SCLK and shifts its input data bits in sequence. An output circuit 3900 of the buffer memory 3000 provides data bits from the shift register 3800 to an external system (e.g., a host, as shown in FIG. 1). The shift register 3800, coupled between the multiplexer 3700 and the output circuit 3900, may be formed of plural flip-flops operating in sync with the clock signal SCLK.

Figure 5:
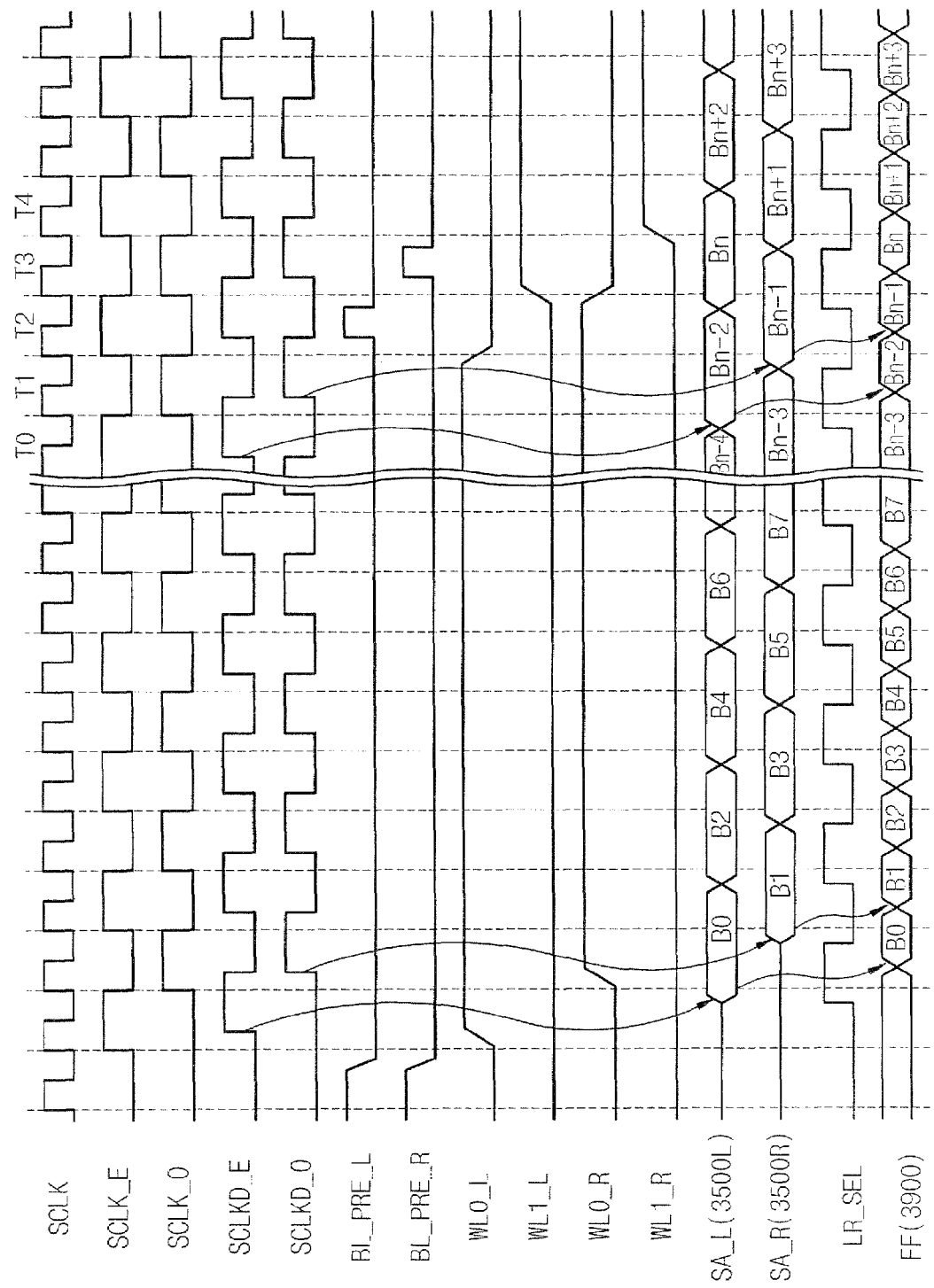
FIG. 5 is a timing diagram showing an exemplary embodiment of a read operation of the buffer memory shown in FIG. 4 according to some of the inventive principles of this patent disclosure.

FIG. 5 is a timing diagram showing an embodiment of a read operation of the buffer memory 3000 shown in FIG. 4. Once a host provides a NOR-NAND flash memory device with information about data to be read, the NOR-NAND flash memory device outputs the data required by the host (e.g., all page data stored in a memory block or data of sequential pages) in sync with the clock signal SCLK. A control block regulates operations of a nonvolatile memory core and the buffer memory in accordance with requests from the host. For instance, the control block operates the nonvolatile memory core to transfer one page of data from the nonvolatile memory cell array to the page buffer. After one page of data is transferred to the page buffer from the nonvolatile memory cell array, the page of data is further transferred to the buffer memory under controlled of the control block. Once the page of data is stored in the buffer memory, the host outputs an initial address to the buffer memory along with the clock SCLK. The clock generation circuit 3600, as illustrated in FIG. 5, outputs the clock signals, SCLK_E, SCLKD_E, SCLK_O, and SCLKD_O, and the selection signal LR_SEL.

First, the row decoder 3200L of the buffer memory 3000 activates a wordline (e.g., WL0_L) corresponding to the initial row address. Before activation of the wordline WL0_L, as shown in FIG. 5, the control signals BLPRE_L and BLPRE_R are switched low, which deactivates the precharging circuits 3300L and 3300R. Upon activation of the wordline WL0_L, the column decoder 3400L partially selects the bitlines BLj_L of the mat 3100L (e.g., 16 bitlines) in sync with the clock signal SCLK_E. The column decoder 3400L selects the bitlines in response to the initial column address, and sequentially increases the column address in sync with the clock signal SCLK_E. The sense amplifier 3500L latches a data bit (e.g., B0) of the selected bitlines in sync with the clock signal SCLKD_E. When the selection signal LR_SEL is switched high, the multiplexer 3700 selects the data bit B0, which is latched in the sense amplifier 3500L, in response to low-to-high transition of the clock signal SCLK, and then outputs the selected data bit B0 to the shift register 3800.

As can be seen from FIG. 5, the wordline WL0_R arranged on the mat 3100R may be activated after a predetermined time from the time the wordline WL0_L of the mat 3100R has been activated. For example, the predetermined time may be one cycle of the clock signal SCLK or any other suitable time period. With the activation of the wordline WL0_R, the column decoder 3400R partially selects the bitlines BLj_R of the mat 3100R (e.g., 16 bitlines) in sync with the clock signal SCLK_O. The column decoder 3400R selects the bitlines in response to the initial column address, and sequentially increases the column address in sync with the clock signal SCLK_O. The sense amplifier 3500R latches a data bit (e.g., B1) of the selected bitlines in sync with the clock signal SCLKD_O. When the selection signal LR_SEL is low, the multiplexer 3700 selects the data bit B1, which is latched in the sense amplifier 3500R, in response to low-to-high transition of the clock signal SCLK, and then outputs the selected data bit B1 to the shift register 3800.

After that, as the output data bits of the sense amplifiers 3500L and 3500R are alternately selected by the same method aforementioned, the data bits are sequentially latched by the shift register 3800 every cycle of the clock signal SCLK.

Referring to FIG. 5, during cycle T0 of the clock signal SCLK, the last data bit Bn−2 of the wordline WL0_L is latched in the sense amplifier 3500L through the column decoder 3400L in sync with SCLKD_E. The latched data bit Bn−2 is transferred to the shift register 3800 through the multiplexer 3700 in sync with a low-to-high transition of the clock signal SCLK during cycle T1. Similarly, during cycle T1 of the clock signal SCLK, the last data bit Bn−1 of the wordline WL0_R is latched in the sense amplifier 3500R through the column decoder 3400R in sync with SCLKD_O. The latched data bit Bn−1 is transferred to the shift register 3800 through the multiplexer 3700 in sync with low-to-high transition of the clock signal SCLK during a cycle T2.

As the last data bit Bn−2 of the wordline WL0_L is latched in the shift register 3800 in sync with the clock signal SCLK during cycle T1, the wordline WL0_L is deactivated in sync with the clock signal SCLK during cycle T2 and the control signal BLPRE_L is activated in sync with the clock signal SCLK during cycle T2. With the activation of the control signal BLPRE_L, a precharging operation is carried out for the mat 3100L. During cycle T3 of the clock signal SCLK, the next wordline WL1_L of the mat 3100L is activated in sync with the clock signal SCLK during cycle T3. Similarly, as the last data bit Bn−1 of the wordline WL0_R is latched in the shift register 3800 in sync with the clock signal SCLK during cycle T2, the wordline WL0_R is deactivated in sync with the clock signal SCLK during cycle T3 and the control signal BLPRE_R is activated in sync with the clock signal SCLK during cycle T3. With the activation of the control signal BLPRE_R, a precharging operation is carried out for the mat 3100R. During a cycle T4 of the clock signal SCLK, the next wordline WL1_R of the mat 3100R is activated in sync with the clock signal SCLK during cycle T4.

Thereafter, data output operations associated with the next wordlines WL1_L and WL1_R are executed in the same way aforementioned, so will not be described further.

As illustrated in FIG. 5, the data bits from the mats 3100L and 3100R are alternately stored in the shift register 3800, so that it is possible to assure sufficient precharging time for the mats 3100L and 3100R. This operational feature may offer improvement of data transfer rate (or data burst frequency) without restriction as to precharging time.

As described above, while assuring a sufficient time for precharging each of the mats 3100L and 3100R, it may be possible to improve a data transfer rate (or a data burst frequency) without restricting the precharging time.

The embodiments described herein may be modified in arrangement and detail without departing from the inventive principles. For example, embodiments have been described having specific number of mats, but the inventive principles are not limited to these details. The leveled wordline driving scheme has been employed with a buffer memory with two mats; however, it may be applied to buffer memories with only one mat or to buffer memories with more than two mats. Accordingly, such variations are considered to fall within the scope of the following claims.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A flash memory device comprising:
a nonvolatile memory core; and
a buffer memory to temporarily store data for the nonvolatile memory core;
wherein the buffer memory is divided into first and second mats, each mat including a plurality of wordlines and bitlines;
wherein a bit of data can be transferred from the second mat while columns of the first mat are being precharged; and
wherein after the last data bit belonging to a first active row of the first mat is transferred during an (N−1)th cycle of a clock signal, the first active row of the first mat is deactivated, a first precharge signal is enabled during an Nth cycle of the clock signal to precharge columns of the first mat, and a data bit belonging to a first active row of the second mat is transferred during the Nth cycle of the clock signal.

2. The flash memory of claim 1 wherein:
the first mat includes a first wordline and the first wordline is kept active until completion of a read operation of more than one memory cells associated with the first wordline; and
the second mat includes a second wordline and the second wordline is kept active until completion of a read operation of more than one memory cells associated with the second wordline.

3. The flash memory of claim 1 further comprising a multiplexer to alternately select and transfer data bits from the first and the second mats in response to a selection signal.

4. The flash memory device of claim 1, wherein a corresponding selected wordline is deactivated after completing a read operation of all memory cells associated with the corresponding selected wordline.

5. The flash memory device of claim 1, wherein the buffer memory further comprises:
a first precharging circuit configured to precharge columns of the first mat in response to the first precharging signal; and
a second precharging circuit configured to precharge columns of the second mat in response to a second precharging signal.

6. The flash memory device of claim 3, wherein after the active row of the first mat in the Nth cycle of the clock signal is deactivated, another row of the first mat in an (N+1)th cycle of the clock signal is activated.

7. The flash memory device of claim 6, wherein after a last data bit belonging to an active row of the second mat is transferred to a shift register in the Nth cycle of the clock signal, the active row of the second mat in an (N+1)th cycle of the clock signal is deactivated and another row of the second mat in an (N+2)th cycle of the clock signal is activated, a second precharging signal being enabled during a predetermined time of the (N+1)th cycle to precharge columns of the second mat.

8. A flash memory device comprising:
a nonvolatile memory core;
a buffer memory to temporarily store data for the nonvolatile memory core, wherein the buffer memory is divided into first and second mats, and comprises a plurality of wordlines and bitlines, and a selected wordline is kept active until completion of a read operation of more than one memory cells associated with the selected wordline;
a clock generation circuit to generate first through fourth internal clock signals and a selection signal in response to an external clock signal provided from a host;
a row decoder circuit to sequentially activate the same rows of the first and second mats in response to a row address;
a first column decoder to select columns of the first mat in a predetermined unit in response to a column address and operate in sync with the first internal clock signal;
a first sense amplifier to detect data bits from bitlines designated by the first column decoder and operate in sync with the second internal clock signal that is delayed from the first internal clock signal;
a second column decoder to select columns of the second mat in a predetermined unit in response to the column address and operate in sync with the third internal clock signal;
a second sense amplifier to detect data bits from bitlines designated by the second column decoder and operate in sync with the fourth internal clock signal that is delayed from the third internal clock signal;
a multiplexer to alternately select data bits detected by the first and second sense amplifiers in response to the selection signal and operate in sync with the external clock signal; and
a shift register to latch data bits transferred through the multiplexer and operate in sync with the external clock signal.

9. The flash memory device of claim 1, wherein the buffer memory is a static random access memory.

10. A flash memory device comprising:
a nonvolatile memory cell array;
a page buffer to read page data from the nonvolatile memory cell array;
a buffer memory to temporarily store the page data of the page buffer, wherein the buffer memory comprises first and second mats including memory cells arranged on rows and columns, a row decoder circuit to sequentially activate corresponding rows of the first and second mats in response to a row address, and a multiplexer to alternately select data bits from the first and the second mats;
a clock generation circuit to generate first and second internal clock signals and a selection signal in response to an external clock signal provided from a host, the first internal clock signal synchronizing with an even-ordered cycle of the external clock signal, the second internal clock signal synchronizing with an odd-ordered cycle of the external clock signal;

a first read circuit to sequentially select columns of the first mat in a predetermined unit and detecting data bits from the selected columns and operate in sync with the first internal clock signal;

a second read circuit to sequentially select columns of the second mat in a predetermined unit and detecting data bits from the selected columns and operate in sync with the second internal clock signal;

a multiplexer to alternately select data bits detected by the first and second read circuits in response to the selection signal and operate in sync with the external clock signal; and a shift register to latch data bits transferred through the multiplexer and operate in sync with the external clock signal.

11. The flash memory device as set forth in claim 10, wherein each of the read circuits comprises:

a column decoder to select columns of the corresponding mat in a predetermined unit in response to a column address and operate in sync with a corresponding internal clock signal; and a sense amplifier to detect data bits from bitlines selected by the column decoder and operate in sync with a clock signal that is delayed from the corresponding internal clock signal.

12. The flash memory device of claim 10, wherein the selection signal has a corresponding phase delayed from the first internal clock signal.

13. The flash memory device of claim 10, wherein the selection signal has a predetermined phase difference delayed from the first internal clock signal.

* * * * *